United States Patent [19]

Obregon

[11] Patent Number: 5,055,714
[45] Date of Patent: Oct. 8, 1991

[54] UNDERSHOOT REDUCTION CIRCUIT

[75] Inventor: Carlos D. Obregon, Tempe, Ariz.

[73] Assignee: Motorola, Inc., Schaumburg, Ill.

[21] Appl. No.: 605,203

[22] Filed: Oct. 29, 1990

[51] Int. Cl.[5] .................... H03K 17/16; H03K 5/12
[52] U.S. Cl. .................................. 307/443; 307/263; 307/542
[58] Field of Search ............... 307/443, 542, 263, 549, 307/567; 361/92

[56] References Cited

U.S. PATENT DOCUMENTS

| | | | |
|---|---|---|---|
| 4,498,021 | 2/1985 | Uya | 307/268 |
| 4,890,015 | 12/1989 | Wise | 307/443 |
| 4,959,561 | 9/1990 | McDermott et al. | 307/443 |
| 4,970,419 | 11/1990 | Hagen et al. | 307/443 X |

OTHER PUBLICATIONS

"Fact QS Output Control", National Semiconductor, Mar. 1990.

Primary Examiner—Stanley D. Miller
Assistant Examiner—Toan Tran
Attorney, Agent, or Firm—Bradley J. Botsch

[57] ABSTRACT

A circuit for reducing negative ground bounce on the ground reference of a CMOS circuit having an input terminal and an output terminal includes an output buffer having an input coupled to the input terminal of the circuit and an output coupled to the output terminal of the circuit. A NOR gate has first and second inputs respectively which are coupled to the input and output terminals of the circuit. An injector circuit is coupled to an output of the NOR gate and to the input terminal of the circuit for providing a predetermined current to the output terminal of the circuit.

14 Claims, 2 Drawing Sheets

5,055,714

UNDERSHOOT REDUCTION CIRCUIT

BACKGROUND OF THE INVENTION

The present invention relates to CMOS circuits and, in particular, to a circuit for reducing output and ground voltage undershoot on the ground reference of a CMOS circuit.

Transient noise can be a problem in CMOS circuits having multiple switching outputs. When the output of a CMOS circuit makes a transition from a logic high state to a logic low state as illustrated by signal $V_{OUT}$ in FIG. 1A, any load capacitance at the output of the CMOS circuit will typically discharge through a package parasitic inductance thereby providing a current to ground as illustrated by signal $I_{GND}$ in FIG. 1B. It is worth noting that due to the voltage-current relationship for a capacitor, the signal $I_{GND}$ is the derivative of signal $V_{OUT}$ where it is assumed that the capacitor of interest is the load capacitor. Further, time $T_{MAX}$ (shown in FIG. 1) is the itme at which signal $V_{OUT}$ changes its point of inflection thereby resulting in a change from a positive to a negative slope for signal $I_{GND}$. Further, the flow of current signal $I_{GND}$ over a period of time will induce unwanted positive and negative voltage spikes on the ground reference of a CMOS curcuit as illustrated by signal $V_{GND}$ in FIG. 1C. Similarly, due to the voltage-current relationship for an inductor, signal $V_{GND}$ is the derivative of signal $I_{GND}$ where it is assumed that the inductor of interest is the package parasitic inductor. The signals shown in FIGS. 1A-1C show the relationship between switching output signal $V_{OUT}$, the output discharge current $I_{GND}$ and the ground voltage $V_{GND}$ as a function of time. Referring specifically to FIG. 1C, the positive portion of signal $V_{GND}$ represents the overshoot voltage or the positive ground bounce, while the negative portion of signal $V_{GND}$ represents the undershoot voltage or the negative ground bounce wherein both positive and negative ground bounce occur as a result of the output of the CMOS circuit making a transition from a logic high state to a logic low state. Further, it should be realized that if the slope of line segment 12 in FIG. 1B could be decreased as shown by line segment 14 in FIG. 1D, the time duration of the undershoot voltage would be increased, but the peak negative voltage of the undershoot voltage would be substantially reduced as illustrated by signal $V_{GND}$ in FIG. 1E. Further, the peak negative undershoot voltage is typically of greater importance than the duration of the voltage undershoot since large negative undershoot voltages can create dynamic threshold problems as is known.

In the past, at least one circuit for reducing the positive ground bounce or overshoot voltage is known. For example, U.S. Pat. No. 4,791,521, by Kenneth W. Ouyang, assigned to Western Digital Corporation and having an issue date of Dec. 13, 1988 discloses a circuit for reducing the level or transient noise for the positive slope of the ground current. However, the patent does not disclose a circuit to reduce the peak negative undershoot voltage.

Hence, a need exists for a circuit that reduces the output and ground voltage undershoot on the ground reference of a CMOS circuit.

SUMMARY OF THE INVENTION

Accordingly, it is an object of the present invention to provide a circuit for reducing the negative ground bounce appearing on the ground reference of a CMOS circuit.

Another object of the present invention is to provide a circuit for reducing the peak negative undershoot appearing on the ground reference of a CMOS circuit when the output of the CMOS circuit makes a logic high to a logic low transition.

Yet another object of the present invention is to provide an improved circuit for reducing the output and ground voltage undershoot and having an output disable option.

In carrying out the above and other objects of the present invention there is provided a circuit for reducing negative ground bounce having an input terminal and an output terminal comprising an output buffer having an input and an output, the input being coupled to the input terminal of the circuit, and the output being coupled to the output terminal of the circuit; a gate circuit having first and second inputs and an output, the first input being coupled to the input terminal of the circuit, and the second input being coupled to the output terminal of the circuit; an injector circuit for providing a predetermined current to the output terminal of the circuit, the injector circuit includes a first transistor having first, second and control electrodes, the second electrode being coupled to a first supply voltage terminal, and the control electrode being coupled to the output of the gate circuit; and a second transistor having first, second and control electrodes, the first electrode being coupled to the first electrode of the first transistor, the second electrode being coupled to the output terminal of the circuit, and the control electrode being coupled to the input terminal of the circuit.

The above and other objects, features and advantages of the present invention will be better understood from the following detailed description taken in conjunction with the accompanying drawings.

BRIEF DESCTIPTION OF THE DRAWINGS

DETAILED DESCRIPTION OF THE INVENTION

Figure 2:
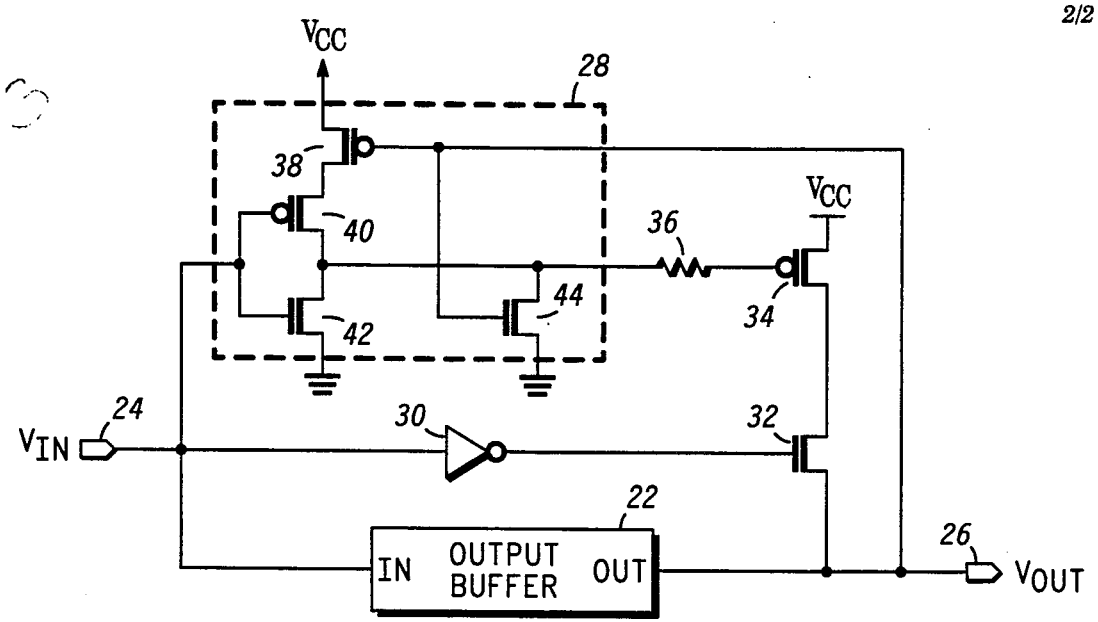
FIG. 2 is a partial schematic diagram of a CMOS circuit having reduced output and ground voltage undershoot in accordance with the present invention.

Referring to FIG. 2, a partial schematic diagram of CMOS circuit 20 having reduced output and ground voltage undershoot is shown comprising output buffer 22 having an input coupled to terminal 24 at which the voltage $V_{IN}$ is applied. The output of output buffer 22 is coupled to terminal 26 for providing voltage $V_{OUT}$. NOR gate 28 has a first input coupled to terminal 24 and a second input coupled to terminal 26. Inventer 30 has an input coupled to terminal 24 and an output coupled to the gate electrode of N-channel MOS transistor 32. The source electrode of N-channel MOS transistor 32 is coupled to terminal 26 while the drain electrode of the same is coupled to the drain electrode of P-channel MOS transistor 34. The source of P-channel MOS transistor 34 is coupled to a first supply voltage terminal at which the operating potential $V_{CC}$ is applied. Resistor 36 is coupled between an output of NOR gate 28 and the gate electrode of P-channel MOS transistor 34.

NOR gate 28 includes P-channel MOS transistor 38 which has its source electrode coupled to operating potential $V_{CC}$ and its drain electrode coupled to the source electrode of P-channel MOS transistor 40. The drain electrode of P-channel MOS transistor 40 is coupled to the output of NOR gate 28 and to the drain electrodes of N-channel MOS transistors 42 and 44. The gate electrodes of P-channel MOS transistor 40 and N-channel MOS transistor 42 are coupled to the first input of NOR gate 28. Further, the gate electrodes of P-channel MOS transistor 38 and N-channel MOS transistor 44 are coupled to the second input of NOR gate 28. Finally, the source electrodes of N-channel MOS transistors 42 and 44 are returned to ground potential.

In operation, NOR gate 28 functions in a well known manner such that if a logic low appears at both of its first and second inputs, the output of NOR gate 28 will be a logic high. Further, if a logic high is present at either the first input or second input, or both inputs of NOR gate 28, the output of NOR gate 28 provides a logic low. Assuming an inital starting point where voltage $V_{IN}$ is indicative of a logic high voltage level, voltage $V_{OUT}$ provided at terminal 26 is also a logic high voltage level via non-inverting output buffer 22. The logic high voltage level appearing at terminal 24 provides a logic low voltage level at the gate electrode of transistor 32 via inverter 30, thereby rendering transistor 32 non-operative. Further, the logic high voltage levels present at terminals 24 and 26 respectively provide logic high voltage levels at the first and second inputs of NOR gate 28. Accordingly, NOR gate 28 responds to provides a logic low voltage level at its output which is transferred to the gate electrode of transistor 34 via resistor 36. However, P-channel MOS transistor 34 will not be conduct current since N-channel MOS transistor 32 is non-operative as aforementioned. In summary, when the voltage levels appearing at terminals 24 and 26 are indicative of logic high voltage levels, N-channel MOS transistor 32 as well as P-channel MOS transistor 34 conduct substantially zero current and, thus, inject substantially zero current to terminal 26.

Figure 1A:
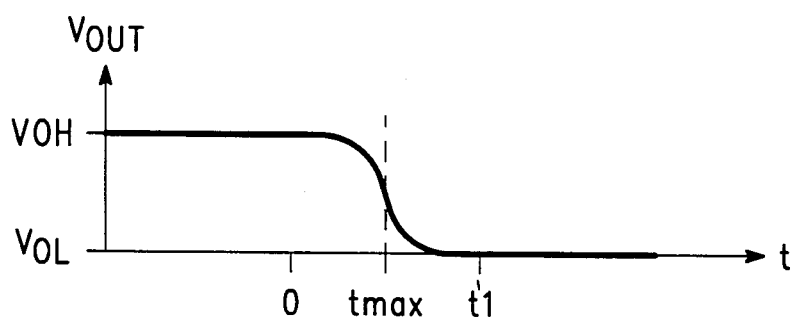
FIGS. 1A-1E are graphical waveforms illustrating various voltage and current signals when the output of a CMOS circuit makes a transition from a logic high state to a logic low state.
Figure 1B:
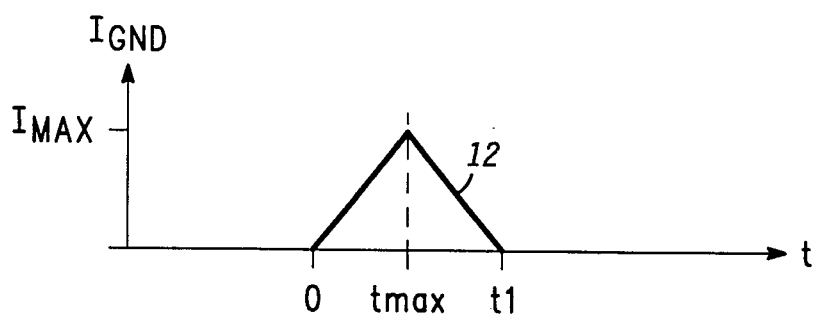
Figure 1C:
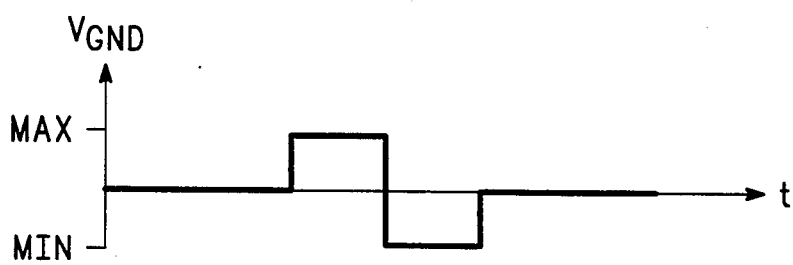
Figure 1D:
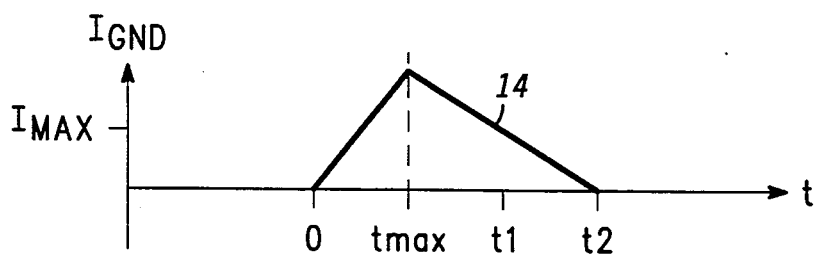
Figure 1E:
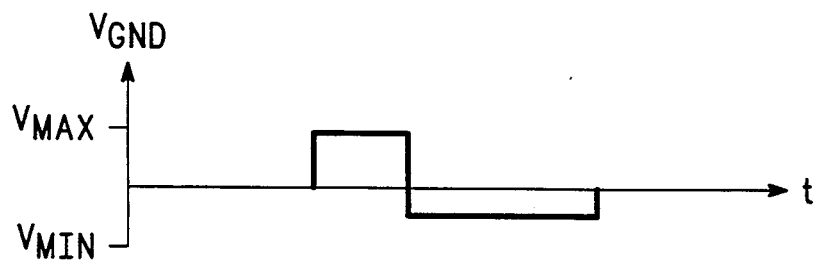

When the voltage at terminal 24 makes a transition from a logic high voltage level to a logic low voltage level, the voltage level provided at terminal 26 begins to transition from a logic high voltage level to a logic low voltage level via non-inverting output buffer 22. However, it is important to realize that there will be a finite time delay between the time that the voltage at terminal 24 reaches a logic low voltage level and the time that the voltage at terminal 26 reaches a logic low voltage level due to the characteristics of output buffer 22. The logic voltage level occurring at terminal 24 is immediately transferred to the gate electrode of N-channel MOS transistor 32 via inverter 30. Note however that N-channel MOS transistor 32 will not be rendered operative yet since the voltage at terminal 26 is still substantially equal to a logic high voltage level. Once the voltage at terminal 26 falls to a predetermined voltage which will be indicative of when voltage $V_{OUT}$ has reached its point of inflection at time $T_{MAX}$ as illustrated in FIG. 1A, N-channel MOS transistor 32 will be rendered operative. At this time, P-channel MOS transistor 34 will conduct current since its gate electrode is at a logic low and N-channel MOS transistor 32 is operative. Further, N-channel MOS transistor 32 and P-channel MOS transistor 34, when operative, function as an injector circuit to inject a feedthrough current to terminal 26. The feedthrough current injected to terminal 26 will add in with the current signal $I_{GND}$ which will result in decreasing the slope of the ground current signal ($I_{GND}$) as aforedescribed and illustrated by segment 14 in FIG. 1D. As a result of decreasing the negative slope of signnal $I_{GND}$, the negative peak undershoot voltage ($V_{MIN}$) is substantially decreased as illustrated in FIG. 1E. Therefore, when P-channel MOS transistor 34 and N-channel MOS transistor 34 inject a feedthrough current at terminal 26 at a time substantially equal to $T_{MAX}$, which is the the time at which the ground current (due to a logic high to a logic low transition occuring at terminal 26) reaches a maximum, the negative ground bounce or peak undershoot voltage on the ground reference of CMOS circuit 20 is substantially reduced.

This feedthrough current will continue to be injected into terminal 26 until the voltage at the gate electrode of P-channel MOS transistor 34 has increased to a predetermined threshold voltage such that P-channel MOS transistor 34 is rendered non-operative. Further, P-channel MOS transistor will be rendered non-operative when the voltage at terminal 26 falls to a predetermined voltage threshold such that the output of NOR gate 28 switches from its original logic low voltage level to a logic high voltage level and when the logic high voltage level occurring at the output of NOR gate 28 is transferred to the gate electrode of P-channel MOS transistor 34 via an RC time constant delay as determined by resistor 36 and an internal gate electrode capacitance associated with P-channel MOS transistor 34. If P-channel MOS transistor 34 is rendered non-operative, substantially zero current will be injected into terminal 26 since N-channel MOS transistor 32 will not be able to pull current out of operating potential VCC.

It is worth noting that resistor 36 can be implemented by a transistor having its first and second electrodes coupled between the output of NOR gate 28 and the gate electrode of P-channel MOS transistor 34, while its control electrode is biased to a predetermined reference voltage. Further, NOR gate 28 is not intended to be restricted to just a NOR function, but can be a plurality of gating circuits for example, an AND, OR or NAND gate.

Figure 3:
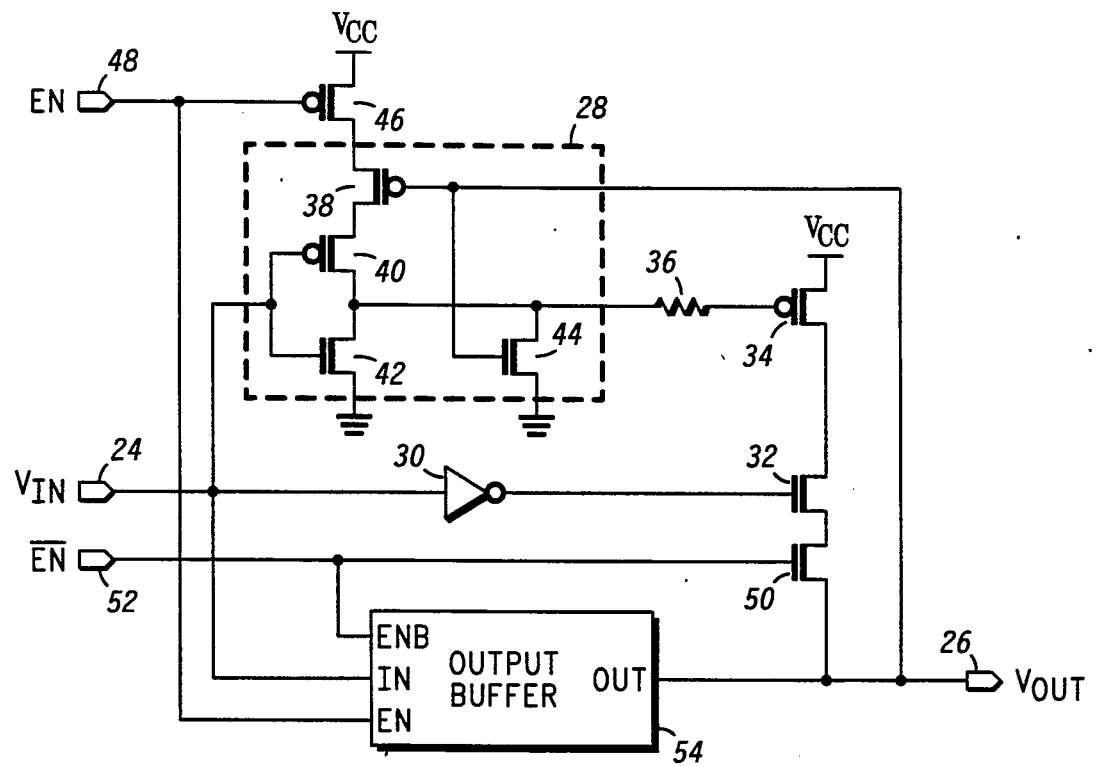
FIG. 3 is a partial schematic diagram of an alternate CMOS circuit having reduced output and ground voltage undershoot in accordance with the present invention.

Referring to FIG. 3, a partial schematic diagram of an alternate CMOS circuit having reduced output and voltage undershoot is shown. It is understood that components similar to those FIG. 2 are designated by the same reference numerals. The circuit in FIG. 3 includes additional tri-state circuitry over the circuit in FIG. 2. The tri-state circuitry comprises P-channel MOS transistor 46 and N-channel MOS transistor 50. Further, output buffer 22 has been replaced by output buffer 54 which includes two additonal differential enable imputs (EN and EN).

The circuit of FIG. 3 further includes P-channel MOS transistor 46 having a source coupled to operating potential $V_{CC}$ and a gate electrode coupled to terminal 48 at which enable signal EN is applied. The drain electrode of P-channel MOS transistor 46 is coupled to the source electrode of P-channel MOS transistor 38 of NOR gate 28. Also, N-channel MOS transistor 50 has a drain electrode coupled to the source electrode of N-channel MOS transistor 32 and a source electrode coupled to terminal 26. Further, the gate electrode of N-channel MOS transistor 50 is coupled to terminal 52 at which an inverted enable signal EN is applied. Further, output buffer 54 has an imput and an output which functions identical to output buffer 22. In addition, output buffer 54 has EN and EN imputs which are respectively coupled to terminals 48 and 52 for tri-state operation.

The operation of the circuit in FIG. 3 is identical to the aforedescribed operation of the circuit in FIG. 2 when signals EN and $\overline{EN}$ are respectively at a logic low and logic high state wherein P-channel MOS transistor 26 as well as N-channel MOS transistor 50 are operative. Further, output buffer 22 is enabled. However, when signal EN is at a logic high state and signal $\overline{EN}$ is at a logic low state, P-channel MOS transistor 46 and N-channel MOS transistor 50 are rendered non-operative thereby indicative of a tri-state condition. Further, output buffer 22 will be disabled thereby providing a high impedance at its respective input and output. Since N-channel MOS transistor 50 is rendered non-operative, substantially zero feedthrough current will be injected at terminal 26. Further, since p-channel MOS transistor 46 is rendered non-operative, substantially zero current will flow from operating potential $V_{CC}$ thereby resulting in substantially zero static power during the tri-state condition. In summary, during the tri-state condition, the circuit of FIG. 3 will consume substantially zero static power and provide substantially zero current at terminal 26.

By now it should be apparent from the foregoing discussion that a novel circuit having a tri-state option has been provided for reducing the output and ground voltage undershoot on the ground reference of a CMOS circuit.

I claim:

1. A circuit for reducing negative ground bounce having an input terminal and an output terminal comprising;

an output buffer having an input and an output, said input being coupled to the input terminal of the circuit, and said output being coupled to the output terminal of the circuit;

a gate circuit having first and second inputs and an output, said first input being coupled to the input terminal of the circuit, and said second input being coupled to the output terminal of the circuit;

injector means for providing a predetermined current to the output terminal of the circuit, said injector means includes:

a first transistor having first, second and control electrodes, said second electrode being coupled to a first supply voltage terminal, and said control electrode being coupled to said output of said gate circuit; and a second transistor having first, second and control electrodes, said first electrode being coupled to said first electrode of said first transistor, said second electrode being coupled to the output terminal of the circuit, and said control electrode being coupled to the input terminal of the circuit.

2. The circuit according to claim 1 further includes:

resistive means coupled between said output of said gate circuit and said control electrode of said first transistor of said injector means for decreasing the rate of a logic transition occurring at said control electrode of said first transistor.

3. The circuit according to claim 2 further includes:

an iverter having an input and an output, said input being coupled to the input terminal of the circuit, and said output being coupled to said control electrode of said second transistor of said injector means.

4. The circuit according to claim 3 wherein said gate circuit includes:

a first transistor having first, second and control electrodes, said second electrode being coupled to said first supply voltage terminal, and said control electrode being coupled to said second input of said gate circuit;

a second transistor having first, second and control electrodes, said second electrode being coupled to said first electrode of said first transistor of said gate circuit, and said control electrode being coupled to said first input of said gate circuit;

a third transistor having first, second and control electrodes, said first electrode being coupled to said first electrode of said second transistor of said gate circuit said second electrode being coupled to a second supply voltage terminal, and said control electrode being coupled to said control electrode of said second transistor of said gate circuit; and a fourth transistor having first, second and control electrodes, said first electrode being coupled to said first electrode of said third transistor of said gate circuit, said second electrode being coupled to said second supply voltage terminal, and said control electrode being coupled to said control electrode of said first transistor of said gate circuit.

5. A circuit for reducing negative ground bounce having an input terminal and an output terminal, comprising;

an output buffer having an input and an output, said input being coupled to the input terminal of the circuit, and said output being coupled to the output terminal of the circuit;

a gate circuit having first and second inputs and an output, said first input being coupled to the input terminal of the circuit, and said second input being coupled to the output terminal of the circuit;

injector means for providing a predetermined current to the output terminal of the circuit, said injector means includes:

a first transistor having first, second and control electrodes, said second electrode being coupled to a first supply voltage terminal, and said control electrode being coupled to said output of said gate circuit; and a second transistor having first, second and control electrodes, said first electrode being coupled to said first electrode of said first transistor, and said control electrode being coupled to the input terminal of the circuit; and tri-state means responsive to a plurality of enable signals and coupled to said gate circuit and to said second electrode of said second transistor of said injector means for disabling the circuit when said enable signals are in a predetermined logic state.

6. The circuit according to claim 5 further includes:

resistive means coupled between said output of said gate circuit and said control electrode of said first transistor for decreasing the rate of a logic transition occurring at said control electrode of said first transistor of said injector means.

7. The circuit according to claim 6 further includes:

an inverter having an input and an output, said input being coupled to the input terminal of the circuit, and said output being coupled to said control electrode of said second transistor of said injector means.

8. The circuit according to claim 7 wherein said tri-state means includes:
- a first transistor having first, second and control electrodes, said first electrode being coupled to said gate circuit, said second electrode being coupled to said first supply voltage terminal, and said control electrode being coupled to a first one of said plurality of enable signals; and
- a second transistor having first, second and control electrodes, said first electrode being coupled to said second electrode of said second transistor of said injector means, said second electrode being coupled to the output terminal of the circuit, and said control electrode being coupled to said second one of said plurality of enable signals.

9. The circuit according to claim 8 wherein said gate circuit includes:
- a first transistor having first, second and control electrodes, said second electrode being coupled to said first electrode of said first transistor of said tri-state means, and said control electrode being coupled to said second input of said gate circuit;
- a second transistor having first, second and control electrodes, said second electrode being coupled to said first electrode of said first transistor of said gate circuit, and said control electrode being coupled to said first input of said gate circuit;
- a third transistor having first, second and control electrodes, said first electrode being coupled to said first electrode of said second transistor of said gate circuit, said second electrode being coupled to a second supply voltage terminal, and said control electrode being coupled to said control electrode of said second transistor of said gate circuit; and
- a fourth transistor having first, second and control electrodes, said first electrode being coupled to said first electrode of said third transistor of said gate circuit, said second electrode being coupled to said second supply voltage terminal, and said control electrode being coupled to said control electrode of said first transistor of said gate circuit.

10. A circuit for reducing negative ground bounce having an input signal applied at an input terminal thereof and an output signal supplied at an output terminal thereof, comprising;
- an output buffer having an input and an output, said input being responsive to the input signal, and said output being coupled to the output terminal of the circuit for providing the output signal;
- gate means having first and second inputs responsive to the input signal and the output signal for providing a control signal at an output thereof, said control signal being in a first logic state when the input signal and the output signal are in predetermined logic states; and
- injector means responsive to said control signal and to the input signal for providing a predetermined current to the output terminal of the circuit wherein said injector current decreases the negative peak undershoot voltage occurring in a ground reference of the circuit.

11. The circuit according to claim 10 wherein said injector means includes:
- a first transistor having first, second and control electrodes, said second electrode being coupled to a first supply voltage terminal, and said control electrode being coupled to said output of said gate means; and
- a second transistor having first, second and control electrodes, said first electrode being coupled to said first electrode of said first transistor of said injector means, said second electrode being coupled to the output terminal of the circuit, and said control electrode being coupled to the input terminal of the circuit.

12. The circuit according to claim 11 further includes:
resistive means coupled between said output of said gate means and said control electrode of said first transistor of said injector means for decreasing the rate of a logic transition occurring at said control electrode of said first transistor of said injector means.

13. The circuit according to claim 12 further includes:
an inverter having an input and an output, said input being coupled to the input terminal of the circuit, and said output being coupled to said control electrode of said second transistor of said injector means.

14. The circuit according to claim 13 wherein said gate means includes:
- a first transistor having first, second and control electrodes, said second electrode being coupled to said first supply voltage terminal, and said control electrode being coupled to said second input of said gate means;
- a second transistor having first, second and control electrodes, said second electrode being coupled to said first electrode of said first transistor of said gate means, and said control electrode being coupled to said first input of said gate means;
- a third transistor having first, second and control electrodes, said first electrode being coupled to said first electrode of said second transistor of said gate means, said second electrode being coupled to a second supply voltage terminal, and said control electrode being coupled to said control electrode of said second transistor of said gate means; and
- a fourth transistor having first, second and control electrodes, said first electrode being coupled to said first electrode of said third transistor of said gate means, said second electrode being coupled to said second supply voltage terminal, and said control electrode being coupled to said control electrode of said first transistor of said gate means.

* * * * *